United States Patent [19]

Muroya et al.

[11] Patent Number: 5,325,328
[45] Date of Patent: Jun. 28, 1994

[54] SENSE AMPLIFIER OUTPUT CIRCUIT USED IN SEMICONDUCTOR MEMORY DEVICES

[75] Inventors: Yukinori Muroya, Yokohama; Shigeru Atsumi, Tokyo, both of Japan

[73] Assignee: Kabushiki Kaisha Toshiba, Kanagawa, Japan

[21] Appl. No.: 777,335
[22] PCT Filed: Mar. 28, 1991
[86] PCT No.: PCT/JP91/00406
 § 371 Date: Jul. 29, 1992
 § 102(e) Date: Jul. 29, 1992
[87] PCT Pub. No.: WO91/15856
 PCT Pub. Date: Oct. 17, 1991

[30] Foreign Application Priority Data

Mar. 30, 1990 [JP] Japan .................................. 2-83945

[51] Int. Cl.⁵ .............................................. G11C 7/00
[52] U.S. Cl. ........................... 365/189.05; 365/189.06; 365/230.08; 365/189.01
[58] Field of Search ....................... 365/230.08, 189.05, 365/189.06, 189.11, 196, 194, 189.01, 190, 203, 204; 307/473

[56] References Cited

U.S. PATENT DOCUMENTS

| 4,891,792 | 1/1990 | Hanamura et al. | 365/189.05 |
| 5,043,944 | 8/1991 | Nakamura et al. | 365/233.5 |
| 5,058,062 | 10/1991 | Wada et al. | 365/189.05 |
| 5,126,974 | 6/1992 | Sasaki et al. | 365/208 |
| 5,126,974 | 6/1992 | Sasaki et al. | 365/189.06 |

FOREIGN PATENT DOCUMENTS 0235889 1/1987 European Pat. Off. .
54029531 5/1979 Japan .

OTHER PUBLICATIONS

IBM Technical Disclosure Bulletin, vol. 32, No. 4A, Sep. 1989, pp. 116–118.
Haraszti, "CMOS/SOS Memory Circuits for Radiation Environments", IEEE Journal of Solid-State Circuits, vol. SC-13, No. 5, Oct. 1978, pp. 669–676.

Primary Examiner—Eugene R. LaRoche
Assistant Examiner—Vu A. Le
Attorney, Agent, or Firm—Banner, Birch, McKie & Beckett

[57] ABSTRACT

This invention, which relates to the output circuit of a sense amplifier that amplifies the signal read from the memory, maintains the output signal stably at a specified level in the presence of equalize pulse signals. Differential amplifiers (36a, 36b) amplify a pair of complementary signals read from the memory. The output terminals of these differential amplifiers (36a, 36b) are connected to each other by transfer gates (N1, P1) controlled by the equalize pulse signals (EQ, /EQ) and also connected to latch circuits (13, 14) via clocked inverter circuits (11, 12). The clocked inverter circuits (11, 12) are put in a high impedance state during the presence of the equalize pulse signals, so that the signals held in the latch circuits (13, 14) remain unchanged.

15 Claims, 5 Drawing Sheets

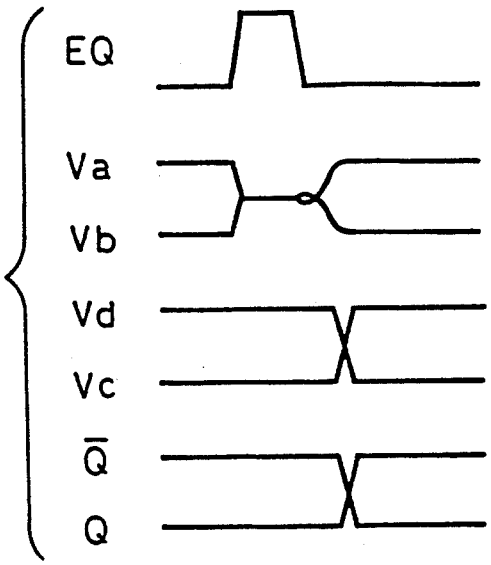
F I G. 3
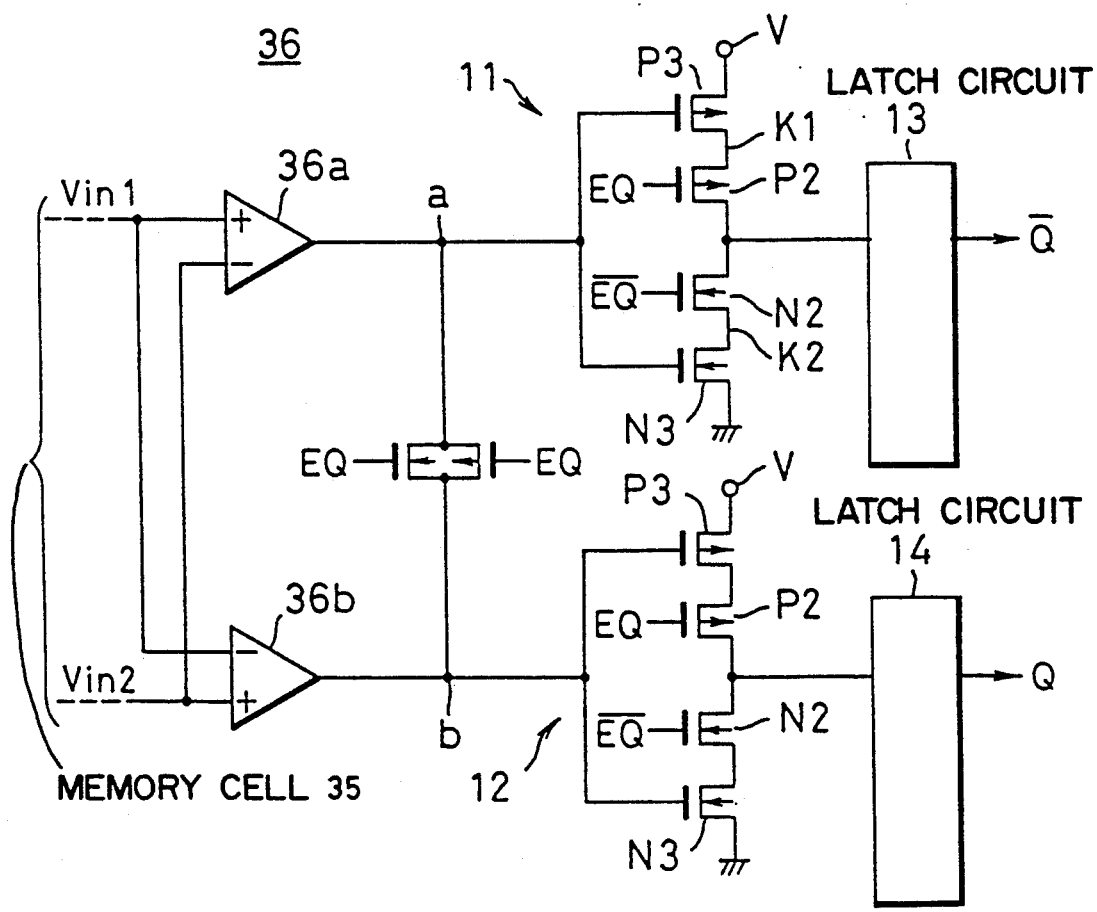
F I G. 4

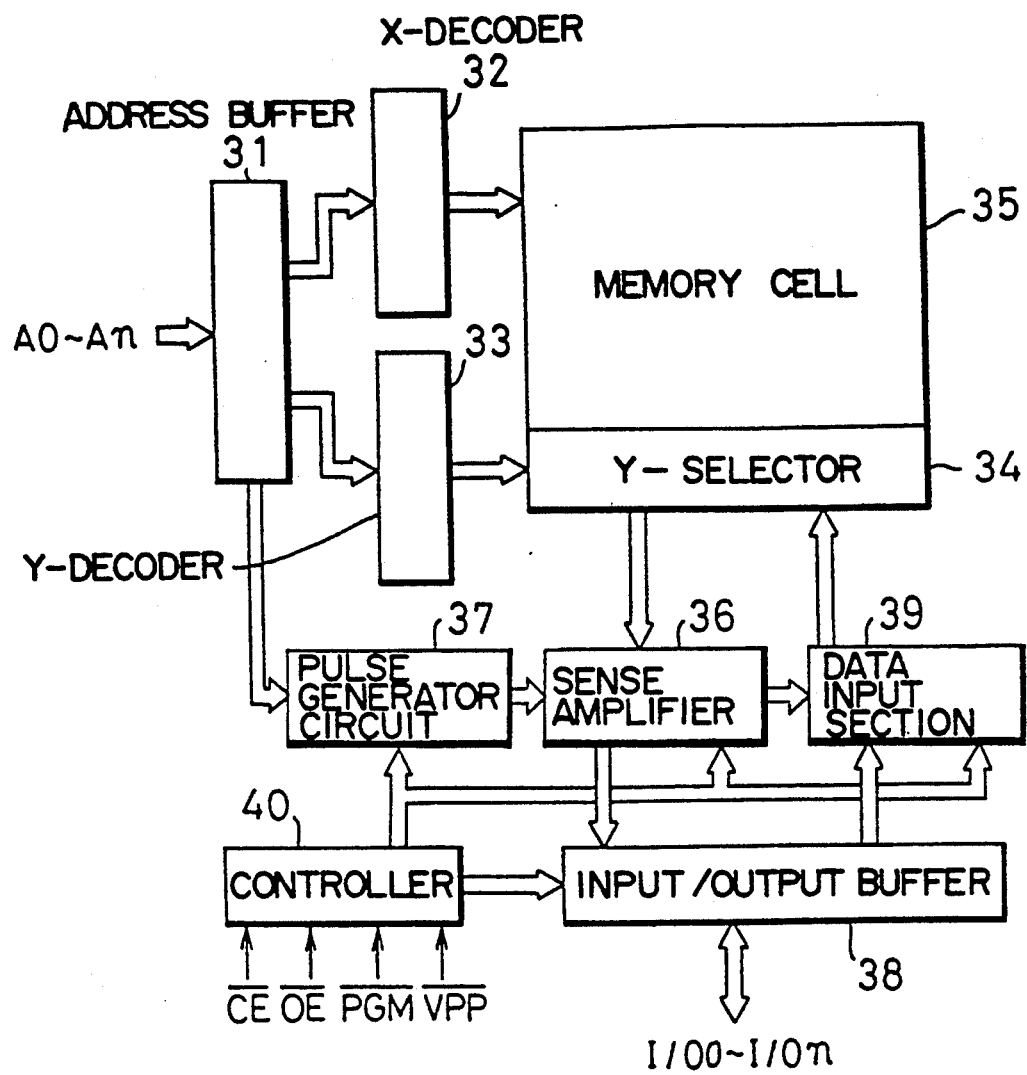
F I G. 6

5,325,328

SENSE AMPLIFIER OUTPUT CIRCUIT USED IN SEMICONDUCTOR MEMORY DEVICES

TECHNICAL FIELD

This invention relates to, for example, a semiconductor memory device having an ATD (Address Transition Detector) that produces a signal according to the change of address, and more particularly to the output circuit of a sense amplifier.

BACKGROUND ART

FIG. 6 illustrates an important part of a conventional semiconductor memory device such as an EPROM. This semiconductor memory device comprises: for example, an address buffer 31 that stores the data read address signal temporarily; an X-decoder 32 and a Y-decoder 33 that decode the address signal from the address buffer 31; a Y-selector 34 that receives the output of the Y-decoder 33; a memory cell unit 35 from which a particular cell is selected depending o the outputs of the Y-selector 34 and X-decoder 32; a sense amplifier 36 that amplifies the signal read out of the memory cell unit 35 and supplied from the Y-selector 34 and produces a data signal with a specified level; a pulse generator circuit (ATD) 37 that senses the change of address signal in the address buffer 31, generates a specified pulse signal (hereinafter, referred to as an equalizer pulse signal), and supplies it to the sense amplifier 36; an input/output buffer circuit 38 that outputs the data signal from the sense amplifier 36; a data input section 39 that drives transistors (not shown) in the Y-selector 34 depending on the data from the input/output buffer circuit 38; and a controller 40 that controls the sense amplifier 36, pulse generator circuit 37, input/output buffer circuit 38, and data input section 39 on the basis of the chip enable signal /CE, output enable signal /OE, program (write) signal /PGM, and power supply $V_{pp}$.

The memory cell unit 35 is composed of, for example, a referential EPROM and is designed to allow the simultaneous reading of signals of different levels.

The sense amplifier 36 is designed to produce signals of a specified level by, for example, three-stage amplification of different-level signals from the memory cell unit 35 via the Y-selector 34. Each of the first through third stage amplifying section is made up of a pair of differential amplifiers and a transfer gate circuit that equalizes the outputs of the differential amplifier pair to the same level on the basis of the equalize pulse signal from the pulse generator circuit 37.

FIG. 7 illustrates the construction of the third-stage amplifying section and output circuit.

The differential amplifiers 36a and 36b compare the signals from the second-stage amplifying section (not shown) for potential difference and judges whether the signal is at the "1" or "0" level. These differential amplifiers 36a and 36b are supplied with input signals so as to each produce signals of different levels, that is, the output level of the differential amplifier 36b is "0" when the output level of the differential amplifier 36a is "1". Specifically, the input signal $V_{in1}$ is supplied to both the non-inverted input terminal of the differential amplifier 36a and the inverted terminal of the differential amplifier 36b, while the input signal Vin2 is supplied to both the non-inverted input terminal of the differential amplifier 36b and the inverted terminal of the differential amplifier 36a.

The output terminals of the differential amplifiers 36a and 36b are connected to inverter circuits 36c and 36d, respectively. Connected across the output terminals of the amplifiers 36a and 36b is a transfer gate 36e consisting of a p-channel transistor P1 and an n-channel transistor N1 connected in parallel. The gates of the n-channel transistor N1 and p-channel transistor P1 are supplied with the equalize pulse signals EQ and /EQ from the pulse generating circuit 37, respectively.

The operation of this arrangement will be explained, referring to FIG. 8.

Before the change of address ADD, the potential Va of the node a between the differential amplifier 36a and inverter circuit 36c is at the "1" level, the potential Vb of the node b between the differential amplifier 36b and inverter circuit 36d is at the "0" level, the output potential Q of the inverter circuit 36c is at the "0" level, and the output potential /Q of the inverter circuit 36d is at the "1" level. In this state, when address ADD is changed, the pulse generator circuit 37 produces the equalize pulse signals EQ and /EQ. Then, the transistors P1 and N1 receiving the equalize pulses EQ and /EQ turn conductive, thereby equalizing the potentials Va and Vb of both nodes a and b.

Next, when the equalize pulse signals EQ and /EQ cease, the transistors P1 and N1 become non-conductive, which allows the potentials Va and Vb of the output nodes a and b of the differential amplifiers 36a and 36b to return to the original potentials at which the amplifiers 36a and 36b judged the nodes to be.

When the equalize pulse signals EQ and /EQ make the transistors P1 and N1 conductive, the potentials Va and Vb of the output terminals of the differential amplifiers 36a and 36b are at an intermediate potential. Therefore, the inverter circuits 36c and 36d cannot determine whether the input potentials are at the "0" or "1" level, which makes the output potentials Q and /Q indeterminate, leading to a possibility of producing erroneous outputs.

With the conventional circuit configuration, some time is required for the output potentials of the inverter circuits 36c and 36d to return to normal after the equalize pulse signals EQ and /EQ ceased, which makes it difficult to achieve high-speed operation.

DISCLOSURE OF INVENTION

The object of the present invention is to provide a sense amplifier output circuit for semiconductor memory devices which can maintain the output signal stably at a specified level even in the presence of equalize pulse signals and achieve high-speed operation by shortening the time from when the equalize pulse signal ceases till a normal signal appears.

The foregoing object is accomplished by a sense amplifier output circuit used in semiconductor memory devices that contains amplifiers for generating equalize pulse signals according to the change of address and based on the equalize pulse signals, separately amplifying a pair of signals read from the memory, and an equalize circuit for equalizing the output signal of the amplifier, characterized by comprising: latch circuits for latching the output signals from the amplifiers; and cut-off circuits that are provided on the input side of the latch circuits and during the equalizing operation at the equalize circuit, cut off the signals to the latch circuits according to the equalize pulse signals.

With this arrangement, during the equalize period of time when the equalize pulse is being generated, the cut-off circuit cuts off the signal read from the memory and in the meantime, the latch circuit supplies the latched signal. Therefore, it is possible to prevent the output signal from being at an indeterminate level, which ensures a reliable output signal. As soon as the equalize pulse has ceased, the cut-off state disappears to allow the signal to be supplied, which enables high-speed operation.

BRIEF DESCRIPTION OF DRAWINGS

FIG. 3 shows waveforms for the purpose of explaining the operation of the circuit of FIG. 1;

FIG. 4 is a circuit diagram for an important part of a second embodiment of the present invention;

FIG. 6 is a block diagram for a semiconductor memory device to which the present invention is applied;

BEST MODE OF CARRYING OUT THE INVENTION

Referring to the accompanying drawings, a first embodiment of the present invention will be explained.

Figure 1:
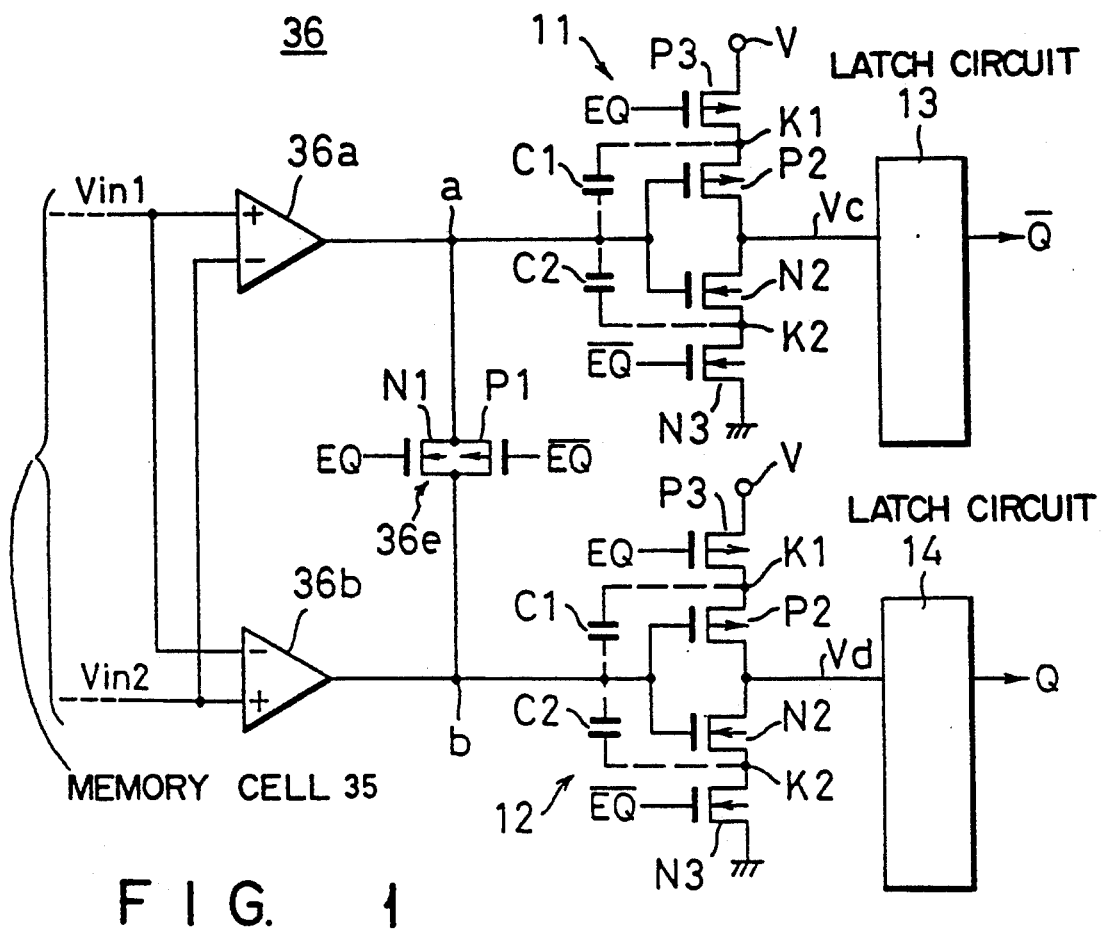
FIG. 1 is a circuit diagram for an important part of a first embodiment of the present invention.
Figure 7:
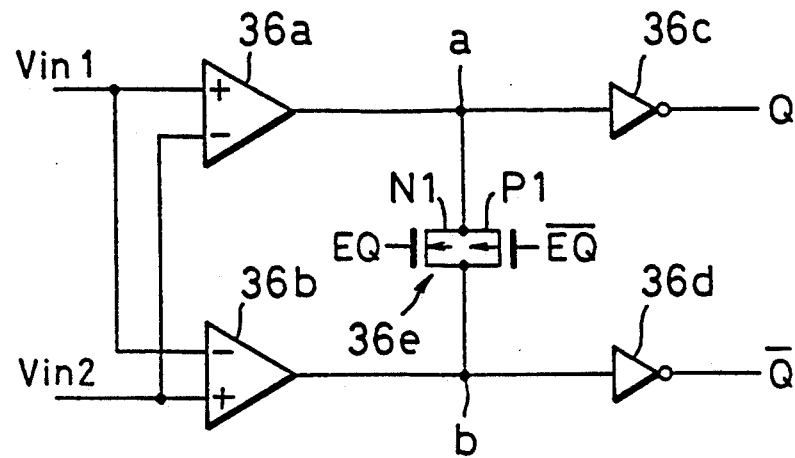
FIG. 7 is a circuit diagram for an important part of a conventional sense amplifier.
Figure 8:
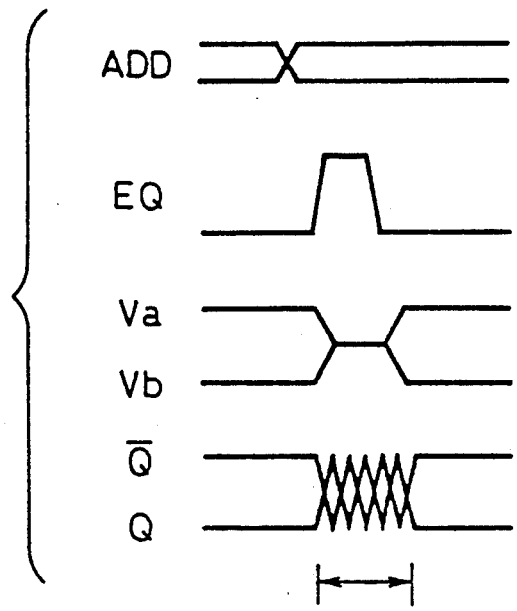
FIG. 8 shows waveforms with the object of describing the operation of the circuit of FIG. 7.

FIG. 1 illustrates the third-stage amplifying section of the sense amplifier 36. The same parts as those in FIG. 7 are indicated by the same reference characters, and explanation will be focused mainly on different parts from those of FIG. 7.

The output terminals of the differential amplifiers 36a and 36b are connected to latch circuits 13 and 14 via clocked (CMOS) inverter circuits 11 and 12, respectively. The latch circuits 13 and 14 latch the signals that have been judged at the differential amplifiers 36a and 36b.

The clocked inverter circuits 11 and 12 have the same configuration, so that only the construction of the inverter circuit 11 will be explained, and for the inverter circuit 12, the same parts as those of the inverter circuit 11 are indicated by the same reference characters and their explanation will be omitted.

The clocked inverter circuit 11 is composed of a series connection of the current paths of p-channel transistors P2 and P3 and n-channel transistors N2 and N3 between the power supply V and the ground. The gates of the p-channel transistor P2 and n-channel transistor N2 are connected to the output terminal of the differential amplifier 36a. The drains of the transistor P2 and transistor N2 are connected to the input terminal of the latch circuit 13. The source of the transistor P2 is connected to the drain of the p-channel transistor P3 whose gate receives the equalize pulse signal EQ and whose source is connected to the power supply V. The source of the transistor N2 is connected to the drain of the n-channel transistor N3 whose gate receives the equalize pulse signal /EQ and whose source is connected to the ground.

Figure 2:
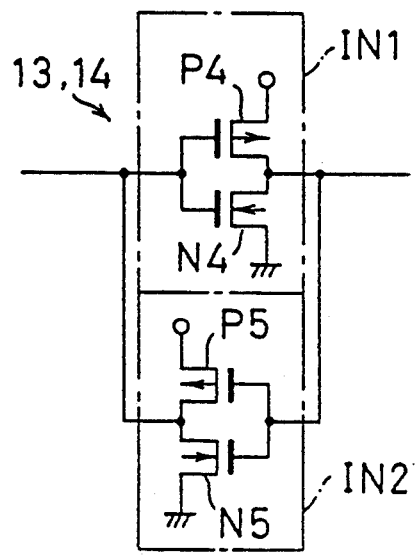
FIG. 2 is a circuit diagram for a part of FIG. 1.
Figure 5:
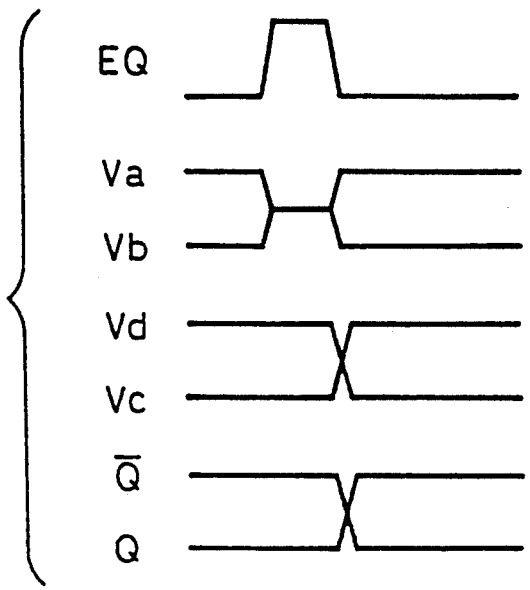
FIG. 5 illustrates waveforms for the purpose of explaining the operation of the circuit of FIG. 4.

FIG. 2 illustrates the construction of the latch circuits 13 and 14.

The latch circuits 13 and 14 are each made up of two CMOS inverter circuits IN1 and IN2. The inverter circuits IN1 and IN2 consist of p-channel and n-channel transistors P4 and N4, and P5 and N5, respectively.

With this arrangement, the operation will be described, referring to FIG. 3.

With the address remaining unchanged and the equalize signal EQ being absent, the transistors P3 and N3 of the clocked inverter circuits 11 and 12 are in the conducting state. In this state, depending on the potentials Va and Vb of the output terminals of the differential amplifiers 36a and 36b, the output potentials Vc and Vd of the clocked inverter circuits 11 and 12 are at the "0" level and "1" level, respectively, which are latched at the latch circuits 13 and 14. As a result, the output potentials /Q and Q of the latch circuits 13 and 14 are at the "0" level and "1" level, respectively.

When the address changes and the pulse generator circuit 37 produces the equalize pulse signals EQ and /EQ, these signals EQ and /EQ make the transistors P1 and N1 conductive, thereby equalizing the output-terminal potentials Va and Vb of the differential amplifiers 36a and 36b. At the same time, the transistors P3 and N3, which make up the clocked inverter circuits 11 and 12, are made non-conductive under the control of the equalize pulse signals EQ and /EQ. As a result, the inverter circuits 11 and 12 go to a high impedance state, preventing the signals from being transferred. Therefore, during the equalizing operation, the latch circuits 13 and 14 supply the signals, which have been latched before the generation of the equalize pulse signals, as Q and /Q, which prevents the output signals from being unstable unlike a conventional approach.

Upon termination of the equalize pulse signals EQ and /EQ, the transistors P1 and N1 turn non-conductive, whereas the transistors P3 and N3 turn conductive, capable of supplying subsequent signals.

With the embodiment, during the equalize period, the clocked inverter circuits 11 and 12 do not transfer signals and instead, the latch circuits 13 and 14 supply the signals latched before the generation of the equalize pulse signals, as Q and /Q. This eliminates an unstable state found in a conventional equivalent, which ensures the reliable output of a signal of a specified level.

In the embodiment, after the equalize pulse signals cease, the output potentials Va and Vb of the differential amplifiers 36a and 36b (referred to as the potentials of nodes a and b) undergo a slight instability temporarily. The cause of this is that the nodes a and b are connected to the gates of the transistors P2 and N2 constituting the clocked inverter circuits 11 and 12.

That is, during the equalize period, the potentials Va and Vb of the nodes a and b are at an intermediate potential, which makes the transistors P2 and N2 partially conductive. At this time, the latch circuits 13 and 14, each consisting of two inverter circuits IN1 and IN2 as shown in FIG. 2, hold the previous data. With the explanation centering on the clocked inverter circuit 11, since the output potential Vc of the clocked inverter circuit 11 is at the "0" level, this makes the transistor P4, making up the inverter circuit IN1, conductive to output a "1" level signal, and the on transistor N5, making up the inverter circuit IN2, is on, which allows the latch circuit 13 to remain at the "1" level.

Since in this state, the transistor P2 in the clocked inverter circuit 11 is partially conductive as stated above, a conducting path from the node K1. connecting the transistors P2 and P3, through the transistor P2 to the transistor N5 is created, reducing the potential of the node K1.

When the equalize pulse signals terminate, the potential Va of the node a tends to return to the "1" level, but because the parasitic capacitance C1 (the gate capacitance + the junction capacitance) between the node K1 and the gate of the transistor P2 is at a low level, the potential of the node a begins to fall temporarily.

In contrast, the potential Vb of the node b starts to rise temporarily, under the influence of the parasitic capacitance C2 between the node K2, connecting the transistors N2 and N3, and the gate of the transistor N2.

For this reason, it will take some time for the potentials of the nodes to reach a potential that can be judged by the inverter circuit IN1 to be at the high or low level. Particularly, the potential of the output node of the differential amplifier changes slowly after the termination of the equalize pulse signal, so that there is some loss of time in high-seed operation, although it is less than that for a conventional equivalent.

FIG. 4 show a second embodiment of the present invention, which solves the problem of loss of time in the first embodiment. In this embodiment, the same parts as those in FIG. 1 are indicated by the same reference characters and the explanation will center on the different parts from the first embodiment.

In FIG. 4, the output terminals of the differential amplifiers 36a and 36b are connected to the gates of the transistors P3 and N3 constituting the clocked inverter circuits 11 and 12. The gates of transistors P2 and N2 are supplied with the equalize pulse signals EQ and /EQ, respectively.

With this configuration, during the presence of the equalize pulse signals EQ and /EQ, the transistors P2 and N2 of the clocked inverter circuits 11 and 12 can be put in a completely non-conductive state. With the explanation centering on the clocked inverter circuit 11, the conducting path from the node K1 through the transistor P2 to the transistor P5, making up the latch circuit 13, can be cut off, which prevents the potential of the node K1 from dropping even when the potential of the node a is at an intermediate potential. Therefore, when the equalize pulse signals EQ and /EQ cease and the potential of the node a returns to its original potential, different pieces of data are prevented from temporarily appearing, which makes it possible to transfer data reliably at high speed.

While in the embodiments, the present invention is applied to EPROMs, it is not restricted to this. For example, it may be applicable to SRAMs.

This invention may be practiced or embodied in still other ways without departing from the spirit and essential character thereof.

INDUSTRIAL APPLICABILITY

As described in detail, the present invention can maintain the output signal stably at a specified level even in the presence of the equalize pulse signal, and achieve a high-speed operation by shortening the time from when the equalize signal ceases till a normal signal appears. This feature is useful for sense amplifiers and its industrial applicability is high.

We claim:

1. A sense amplifier output circuit used in a semiconductor memory device, comprising:
    amplifiers for amplifying first and second signals read from a memory;
    an equalize circuit, connected between output terminals of the amplifiers, for equalizing output signals of the amplifiers in response to first and second equalize pulse signals produced in accordance with a change in address for accessing data in the memory;
    latch circuits for latching the output signals from said amplifiers, respectively; and
    cut-off circuits, each connected between the output terminals of said amplifiers and an input of each latch circuit, for cutting the output signals from said amplifiers off from said latch circuits during an equalizing operation at said equalize circuit.

2. A sense amplifier output circuit according to claim 1, wherein each of said cut-off circuits comprises a clocked inverter circuit that is set to a high impedance state in response to said first and second equalize pulse signals.

3. A sense amplifier output circuit according to claim 2, wherein each of said clocked inverter circuits comprises:
    a first MOS transistor of a first conductivity having a gate connected to the output terminal of one of said amplifiers and a drain connected to an input terminal of one of said latch circuits;
    a second MOS transistor of a second conductivity type having a gate connected to the output terminal of said one of said amplifiers and a drain connected to the input terminal of said one of said latch circuits;
    a third MOS transistor of the first conductivity type having a gate for receiving the first equalize pulse signal, a drain connected to a source of said first MOS transistor, and a source connected to a first power supply; and
    a fourth MOS transistor of the second conductivity type having a gate for receiving the second equalize pulse signal, a drain coupled to a source of said second MOS transistor, and a source coupled to a second power supply.

4. A sense amplifier output circuit according to claim 2, wherein each of said clocked inverter circuits comprises:
    a first MOS transistor of a first conductivity type having a gate receiving the first equalize pulse signal and a drain connected to an input terminal of one of said latch circuits;
    a second MOS transistor of a second conductivity type having a gate receiving the second equalize pulse signal and a drain connected to the input terminal of said one of said latch circuits;
    a third MOS transistor of the first conductivity type having a gate connected to the output terminal of one of said amplifiers, a drain connected to a source of said first MOS transistor, and a source connected to a first power supply; and
    a fourth MOS transistor of the second conductivity type having a gate connected to the output terminal of said one of said amplifiers, a drain connected to a source of said second MOS transistor, and a source connected to a second power supply.

5. A sense amplifier output circuit used in semiconductor memory devices, characterized by comprising:
    a first and second amplifiers for amplifying a pair of complementary signals read from a memory;
    an equalize circuit that is connected across output terminals of the first and second amplifiers and equalizes the potentials of the output terminals of said first and second amplifiers on the basis of equalize pulse signals produced according to a change of address to access data in the memory;

first and second clocked inverter circuits that are connected to the output terminals of said first and second amplifiers, respectively, and set to a high impedance state when receiving said equalize pulse signals;

first and second latch circuits that are connected to output terminals of said first and second clocked inverter circuits, respectively, and that hold outputs of said first and second clocked inverter circuits.

6. A sense amplifier output circuit according to claim 5, wherein said first clocked inverter circuit comprises:

a first MOS transistor of a first conductivity type whose gate is connected to the output terminal of said first amplifier and whose drain is connected to an input terminal of said first latch circuit;

a second MOS transistor of a second conductivity type whose gate is connected to the output terminal of said first amplifier and whose drain is connected to the input terminal of said first latch circuit;

a third MOS transistor of the first conductivity type whose gate receives a first of said equalize pulse signals, whose drain is connected to a source of said first MOS transistor, and whose source is connected to a first power supply; and a fourth MOS transistor of the second conductivity type whose gate receives a second of said equalize pulse signals, whose drain is connected to a source of said second MOS transistor, and whose source is connected to a second power supply.

7. A sense amplifier output circuit according to claim 5, wherein said second clocked inverter circuit comprises:

a first MOS transistor of a first conductivity type whose gate is connected to the output terminal of said second amplifier and whose drain is connected to an input terminal of said second latch circuit;

a second MOS transistor of a second conductivity type whose gate is connected to the output terminal of said second amplifier and whose drain is connected to the input terminal of said second latch circuit;

a third MOS transistor of the first conductivity type whose gate receives a first of said equalize pulse signals, whose drain is connected to a source of said first MOS transistor, and whose source is connected to a first power supply; and a fourth MOS transistor of the second conductivity type whose gate receives a second of said equalize pulse signals, whose drain is connected to a source of said second MOS transistor, and whose source is connected to a second power supply.

8. A sense amplifier output circuit according to claim 5, wherein each of said first and second latch circuits comprises:

a first inverter circuit for inverting an input signal applied to an input terminal thereof; and a second inverter circuit for inverting an output signal from the first inverter circuit and supplying the inverted output signal to the input terminal of the first inverter circuit.

9. A sense amplifier output circuit used in a semiconductor memory device, comprising:

first and second amplifiers for amplifying a pair of complementary signals read from a memory;

an equalize circuit, connected between an output terminal of said first amplifier and an output terminal of said second amplifier, for equalizing the potentials of the output terminals of said first and second amplifiers in response to first and second equalize pulse signals produced in accordance with a change of address for accessing data in the memory;

first and second clocked inverter circuits connected to the output terminals of said first and second amplifiers, respectively, for setting a high impedance state in response to said first and second equalize pulse signals; and first and second latch circuits connected to output terminals of said first and second clocked inverter circuits, respectively, for latching outputs of said first and second clocked inverter circuits.

10. A sense amplifier output circuit according to claim 9, wherein said first clocked inverter circuit comprises:

a first MOS transistor of a first conductivity type having a gate connected to the output terminal of said first amplifier and a drain connected to an input terminal of said first latch circuit;

a second MOS transistor of a second conductivity type having a gate connected to the output terminal of said first amplifier and a drain connected to the input terminal of said first latch circuit;

a third MOS transistor of the first conductivity type having a gate for receiving the first equalize pulse signal, a drain connected to a source of said first MOS transistor, and a source connected to a first power supply; and a fourth MOS transistor of the second conductivity type having a gate for receiving the second equalize pulse signal, a drain connected to a source of said second MOS transistor, and a source connected to a second power supply.

11. A sense amplifier output circuit according to claim 9, wherein said second clocked inverter circuit comprises:

a first MOS transistor of a first conductivity type having a gate connected to the output terminal of said second amplifier and a drain connected to an input terminal of said second latch circuit;

a second MOS transistor of a second conductivity type having a gate connected to the output terminal of said second amplifier and a drain connected to the input terminal of said second latch circuit;

a third MOS transistor of the first conductivity type having a gate for receiving the first equalize pulse signal, a drain connected to a source of said first MOS transistor, and a source connected to a first power supply; and a fourth MOS transistor of the second conductivity type having a gate for receiving the second equalize pulse signal, a drain connected to a source of said second MOS transistor, and a source connected to a second power supply.

12. A sense amplifier output circuit according to claim 9, wherein each of said first and second latch circuits comprises:

a first inverter circuit for inverting an input signal applied to an input terminal thereof; and a second inverter circuit for inverting an output signal of the first inverter circuit and for supplying the inverted output signal to an input terminal of the first inverter circuit.

13. A sense amplifier output circuit according to claim 9, wherein said first clocked inverter circuit comprises:
- a first MOS transistor of a first conductivity type having a gate for receiving the first equalize pulse signal and a drain connected to an input terminal of said first latch circuit;
- a second MOS transistor of a second conductivity type having a gate for receiving the second equalize pulse signal and a drain connected to the input terminal of said first latch circuit;
- a third MOS transistor of the first conductivity type having a gate connected to the output terminal of said first amplifier, a drain connected to a source of said first MOS transistor, and a source connected to a first power supply; and
- a fourth MOS transistor of the second conductivity type having a gate connected to the output terminal of said first amplifier, a drain connected to a source of said second MOS transistor, and a source connected to a second power supply.

14. A sense amplifier output circuit according to claim 9, wherein said second clocked inverter circuit comprise:
- a first MOS transistor of a first conductivity type having a gate for receiving the first equalize pulse signal and a drain connected to an input terminal of said second latch circuit;
- a second MOS transistor of a second conductivity type having a gate for receiving the second equalize pulse signal and a drain connected to the input terminal of said second latch circuit;
- a third MOS transistor of the first conductivity type having a gate connected to the output terminal of said second amplifier, a drain connected to a source of said first MOS transistor, and a source connected to a first power supply; and
- a fourth MOS transistor of the second conductivity type having a gate connected to the output terminal of said second amplifier, a drain connected to a source of said second MOS transistor, and a source connected to a second power supply.

15. A sense amplifier output circuit used in a semiconductor memory device, comprising:
- amplifiers for amplifying first and second signals read from a memory;
- an equalize circuit, connected between output terminals of the amplifiers, for equalizing output signals of the amplifiers in response to first and second equalize pulse signals produced in accordance with a change in address for accessing data in the memory;
- latch circuits for latching the output signals from said amplifiers, respectively; and
- cut-off circuits, each connected between the output terminals of said amplifiers and an input of each latch circuit, for cutting the output signals from said amplifiers off from said latch circuits in response to the first and second equalize pulse signals.

* * * * *